US008580676B2

(12) United States Patent
Chang et al.

(10) Patent No.: US 8,580,676 B2
(45) Date of Patent: Nov. 12, 2013

(54) MULTIPLE LAYER BARRIER METAL FOR DEVICE COMPONENT FORMED IN CONTACT TRENCH

(75) Inventors: Hong Chang, Saratoga, CA (US); John Chen, Palo Alto, CA (US); Limin Weng, Shanghai (CN); Wenjun Li, Shanghai (CN)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/361,486

(22) Filed: Jan. 30, 2012

(65) Prior Publication Data
US 2012/0129328 A1    May 24, 2012

Related U.S. Application Data

(62) Division of application No. 12/606,005, filed on Oct. 26, 2009, now Pat. No. 8,138,605.

(51) Int. Cl.
*H01L 21/4763* (2006.01)
(52) U.S. Cl.
USPC ............ 438/627; 438/629; 438/637; 438/672
(58) Field of Classification Search
USPC ......... 438/627, 628, 629, 637, 643, 653, 656, 438/672
See application file for complete search history.

(56) References Cited

U.S. PATENT DOCUMENTS

| | | | |
|---|---|---|---|
| 6,352,902 B1 | 3/2002 | Aitken et al. | |
| 6,376,369 B1 | 4/2002 | Doan | |
| 6,667,503 B2 | 12/2003 | Koike et al. | |
| 6,680,542 B1 | 1/2004 | Gibson et al. | |
| 6,686,662 B2 | 2/2004 | Merchant et al. | |
| 6,724,087 B1 | 4/2004 | Buynoski et al. | |
| 6,952,052 B1 | 10/2005 | Marathe et al. | |
| 7,413,984 B2 | 8/2008 | Catabay et al. | |
| 7,417,321 B2 | 8/2008 | Tsao et al. | |
| 7,767,526 B1 | 8/2010 | Lee | |
| 7,772,123 B2 | 8/2010 | Birner et al. | |
| 7,795,688 B2 | 9/2010 | Nagahama | |
| 7,799,646 B2 | 9/2010 | Su | |
| 7,829,947 B2 | 11/2010 | Hebert | |
| 7,851,856 B2 | 12/2010 | Hebert | |
| 7,867,852 B2 | 1/2011 | Hebert | |
| 7,879,676 B2 | 2/2011 | Lee | |

(Continued)

OTHER PUBLICATIONS

John Chen, U.S. Appl. No. 12/643,837, filed Dec. 21, 2009.

(Continued)

*Primary Examiner* — Kevin M Picardat
(74) *Attorney, Agent, or Firm* — Joshua D. Isenberg

(57) ABSTRACT

A semiconductor device formed on a semiconductor substrate may include a component formed in a contact trench located in an active cell region. The component may comprise a barrier metal deposited on a bottom and portions of sidewalls of the contact trench and a tungsten plug deposited in a remaining portion of the contact trench. The barrier metal may comprise first and second metal layers. The first metal layer may be proximate to the sidewall and the bottom of the contact trench. The first metal layer may include a nitride. The second metal layer may be between the first metal layer and the tungsten plug and between the tungsten plug and the sidewall. The second metal layer covers portions of the sidewalls of not covered by the first metal layer.

17 Claims, 3 Drawing Sheets

(56) References Cited

U.S. PATENT DOCUMENTS

| | | |
|---|---|---|
| 2002/0127849 A1 | 9/2002 | Lin et al. |
| 2006/0199387 A1 | 9/2006 | Rhodes |
| 2008/0150013 A1 | 6/2008 | Tai |
| 2008/0246082 A1* | 10/2008 | Hshieh .......................... 257/333 |
| 2009/0114949 A1 | 5/2009 | Hebert |
| 2009/0242973 A1 | 10/2009 | Hebert |
| 2010/0099230 A1 | 4/2010 | Tai |
| 2010/0314693 A1 | 12/2010 | Su |
| 2010/0320461 A1 | 12/2010 | Su |
| 2011/0014766 A1 | 1/2011 | Hebert |
| 2011/0049618 A1 | 3/2011 | Lee |
| 2011/0068386 A1 | 3/2011 | Tai |
| 2011/0068395 A1 | 3/2011 | Hebert |
| 2011/0073943 A1 | 3/2011 | Hebert |

OTHER PUBLICATIONS

Hong Chang, U.S. Appl. No. 12/722,384, filed Mar. 11, 2010.
Sik Lui, U.S. Appl. No. 12/731,112, filed Mar. 24, 2010.
Sung-Shan Tai, U.S. Appl. No. 12/782,573, filed May 18, 2010.
Tao Feng, U.S. Appl. No. 12/916,086, filed Oct. 29, 2010.
Sik Lui, U.S. Appl. No. 12/986,179, filed Dec. 14, 2010.
Hong Chang, U.S. Appl. No. 13/010,427, filed Jan. 20, 2011.
Sik Lui, U.S. Appl. No. 13/079,675, filed Apr. 4, 2011.
Notice of Allowance and Fee(s) due issued date Nov. 3, 2011 for U.S. Appl. No. 12/606,005.

* cited by examiner

MULTIPLE LAYER BARRIER METAL FOR DEVICE COMPONENT FORMED IN CONTACT TRENCH

PRIORITY CLAIM

This application is a divisional application claiming the benefit of priority of commonly assigned U.S. patent application Ser. No. 12/606,005, filed Oct. 26, 2009, the entire disclosures of which are incorporated herein by reference.

FIELD OF THE INVENTION

This invention generally relates to MOSFET devices, and more specifically to MOSFET device with integrated Schottky diode in active region contact trench.

BACKGROUND OF THE INVENTION

Power MOSFET devices are commonly used in electronic circuits. Depending on the application, different device characteristics may be desirable. One example application is a DC-DC converter. Schottky diodes are often employed as rectifiers in DC-DC converters and in numerous other power and small signal applications where the forward conduction or switching characteristics of the diode are important. These diodes are used extensively as output rectifiers in switching-mode power supplies and in other high-speed power switching applications such as motor drives for carrying large forward currents. Ultra-low forward voltage drop ($V_f$) under conduction and relatively good blocking performance under a reverse bias, as well as fast reverse recovery time are the desirable characteristics of an efficient Schottky diode.

A Schottky diode is desired that can be monolithically integrated with MOSFET devices in the active region contact trench. The Schottky diodes (SKY) reduce the body diode forward voltage drop ($V_f$) and minimize the stored charge, and have a quick reverse recovery time, making the MOSFET more efficient. The leakage current drain to source ($I_{dss}$) of the Schottky diode is related to the Schottky barrier height. As the barrier height increases, the leakage current decreases, and the forward voltage drop also increases.

For trench MOSFET devices with an integrated Schottky diode formed on flat surface or on large trench contact surface, the Schottky diode is formed without a Tungsten (W) plug. In a trench MOSFET device with a high aspect ratio, e.g., 2.5:1 or greater, the trench contact critical dimension (CD) is very small (i.e., about 0.35 micron width), and tungsten plugs are used in order to form good ohmic contact and avoid forming a contact void.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

Figure 1:
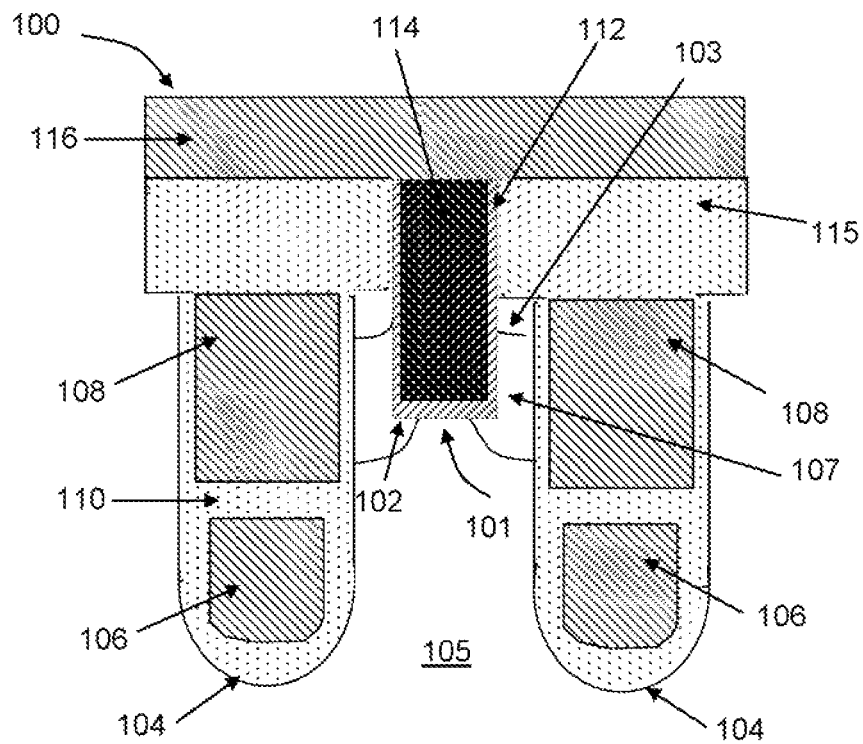
FIG. 1 is a schematic, diagram illustrating a Schottky diode formed in a contact trench of a SGT MOSFET device of the prior art.
Figure 2:
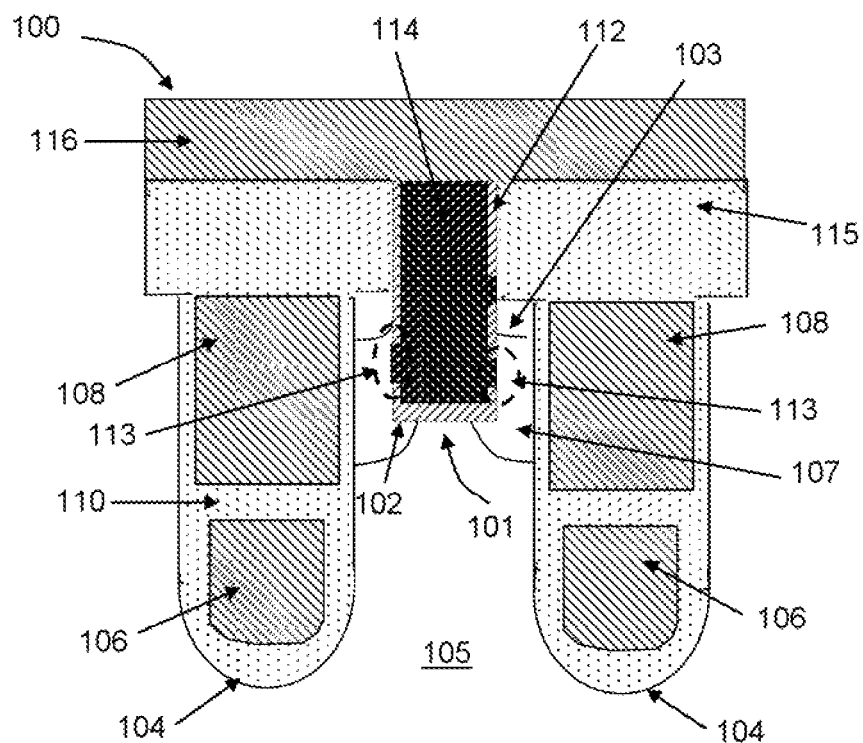
FIG. 2 is a cross-sectional view of a Schottky diode of the type depicted in FIG. 1.

The nature of the particular problem solved by the invention may be appreciated by referring to FIG. 1 and FIG. 2. FIG. 1 is a cross-sectional view showing a conventional shield gate trench (SGT) MOSFET device 100 with a Schottky diode 101 formed in a contact trench 102. As shown in FIG. 1, the contact trench 102 is located in between two gate trenches 104, which are formed in a semiconductor substrate 105, e.g., a silicon (Si) substrate or an epitaxial layer formed on a substrate. The substrate 105 may be doped. In the case of an epitaxial layer formed on a substrate, the substrate is doped with the same conductivity type as the epitaxial layer but with a much higher doping concentration. Each of gate trench 104 includes a first conductive material 106 (e.g., poly 1) acting as a source/shield electrode at the bottom of a gate trench 104 and a second conductive material 108 (e.g., poly 2) provides a gate electrode at the top of the gate trench 104. The first and second conductive materials are electrically insulated from each other by insulating material, e.g., an inter-poly-oxide (IPO) layer 110. The gate electrodes 108 are also electrically insulated from the Schottky diode 101 and contact metal 116 by an insulating material 115.

The Schottky diode 101 can be formed from a metal to semiconductor contact. However, if the semiconductor is relatively highly doped, the contact may be an 'ohmic' contact rather than a Schottky contact, and does not have diode/rectifying properties. The Schottky diode 101 includes a Schottky barrier region formed by suitably doping a region of the semiconductor substrate 105 proximate the bottom of the trench 102 between body regions 107 and forming a suitable contact in the trench. As the term is used here, the Schottky barrier region refers to the semiconductor area just under the contact trench 102 (the semiconductor part of the Schottky diode 101), between the body regions 107. The Schottky barrier region is typically low-doped. For example, when formed in an N-Epi region, a slight P- or P--implant may be carried out to reduce the doping level of the Schottky barrier region. The resulting Schottky barrier region can still be N-type, but less heavily doped N- than the surrounding N-epi region. The implant can help adjust Schottky diode characteristics such as reverse current leakage. As is well-known in the art, the dopant concentration can depend on the type of metal used a contact for the Schottky diode, which affects the Schottky barrier height.

The contact for the Schottky diode 101 typically includes a thin barrier metal 112, e.g., Titanium (Ti) and Titanium Nitride (TiN) deposited at the sidewall and the bottom of the trench 102 and a tungsten plug 114 deposited into the remaining of the trench 102. The barrier metal 112 acts as a diffusion barrier between the tungsten plug and the semiconductor material, typically Silicon (Si) in which the contact trench 102 is formed. In addition to forming the Schottky diode 101, the contact trench 102 may also form an electrical contact to source 103 and body 107 regions of the MOSFET device 100. Voltage applied to the gate electrodes 108 controls the flow of electric current between the source region 103 and a drain (not shown) that is in electrical contact with the substrate 105. It is noted that the barrier metal 112 should not be confused with the Schottky barrier region described above, though they both happen to use the term 'barrier'.

In a standard process of making the shield gate trench MOSFET, a contact trench Schottky diode 101 is formed by depositing a Titanium (Ti) layer of about 400 Angstroms followed by depositing of a Titanium Nitride (TiN) layer of about 1000 Angstroms to form a barrier metal 112 on the sidewall and the bottom of the contact trench. The barrier metal 112 is then heated at 750 C by rapid thermal processing (RTP). Tungsten (W) is then deposited into the remaining of the trench to form W plug 114 followed by the etching back the W plug. An Aluminum Copper (AlCu) layer of about 3 micron is deposited on top of the W plug 114 to form the metal contact 116 (e.g., source metal).

When forming a Schottky diode inside a contact trench, localized defects play a major role in leakage current $I_{dss}$. Normally, the barrier metal 112 blocks the tungsten from coming in contact with the Si. However, poor barrier metal 112 coverage could allow W from the W plug 114 to interact with the Si substrate and thereby create worm defects at sidewall and bottom of the trench 102. Such defects can provide leakage paths and increase leakage current $I_{dss}$ significantly under the targeted forward voltage drop $V_f$. In a worst case scenario, the device channel may be destroyed. Contamination by W may interfere with the proper functioning of the Schottky diode 101 at the bottom of the contact trench 102.

FIG. 2 is a cross-sectional view of a Schottky diode 101 of the type depicted in FIG. 1. As shown in FIG. 2, the Ti/TiN barrier metal 112 does not completely cover portions 113 of the trench sidewall and isolate the Tungsten 114 in the trench from the Silicon of the substrate. As a result, the Tungsten contacts Silicon.

In Schottky diodes formed on a MOSFET device with small trench contact critical dimension (CD), e.g., the width of the trench about 0.35 micron or less, such defects can increase leakage current $I_{dss}$ by at least one to two orders of magnitude under the same forward voltage drop $V_f$. Normally, this problem is more severe when the tungsten plug is used in a portion of a Silicon substrate that is not heavily doped, e.g., in a Schottky diode barrier region. The problem is particularly significant if the trench width is less than about 0.35 microns and the aspect ratio (ratio of depth to width) of the trench is greater than about 2.5:1. In the case of smaller trench width, and greater aspect ratio, it becomes more and more difficult to provide good step coverage with the barrier metal, especially along the sidewalls.

According to embodiments of the present invention, the foregoing problems may be solved by a Schottky diode structure that uses a multiple layer barrier metal to improve step coverage of the barrier metal, particularly at the sidewalls of the trench.

Schottky Diode Structure with Multiple Layer Barrier Metal

Figure 3:
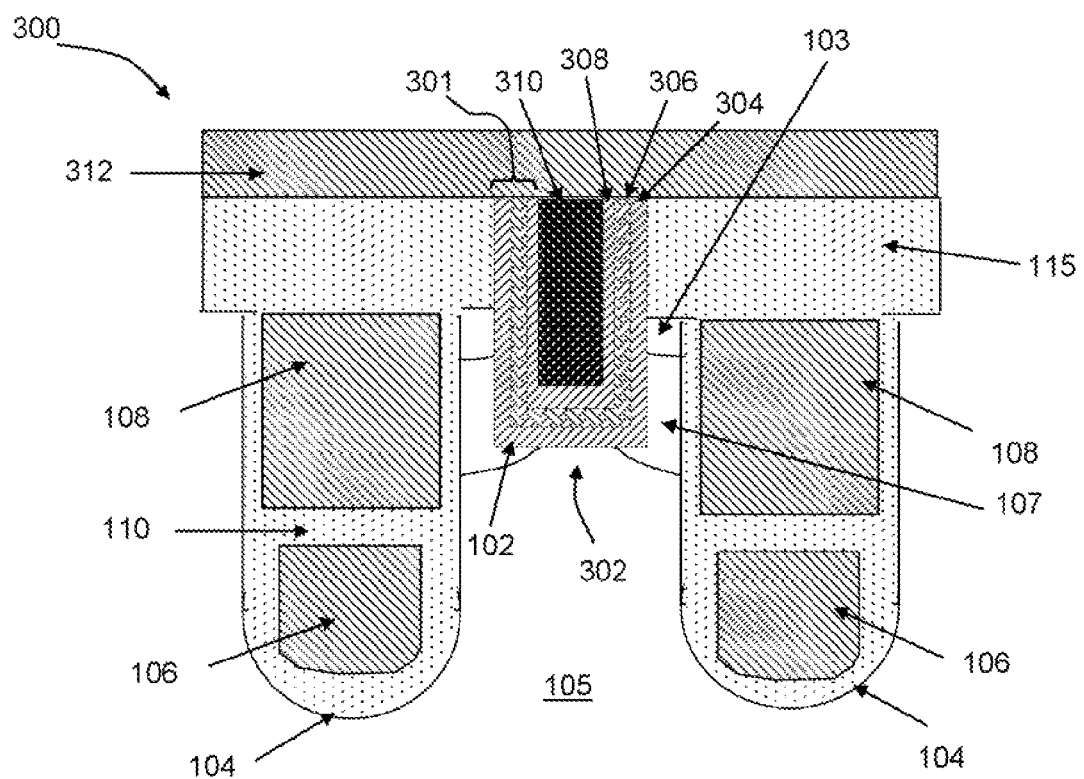
FIG. 3 is a schematic diagram illustrating a Schottky diode formed in a contact trench of a SGT MOSFET device according to an embodiment of the present invention.

FIG. 3 is a cross-sectional view showing an example of a shield gate trench (SGT) MOSFET device 300 with an integrated Schottky diode 302 formed in a contact trench 102 according to an embodiment of the present invention. The contract trench 102 may be formed in a silicon portion of a semiconductor substrate/epitaxial layer 105. The contact trench 102 may have a width less than about 0.35 microns and an aspect ratio of about 2.5:1 or greater.

Similar to the SGT MOSFET device 100 of FIG. 1, the contact trench 102 is located between two gate trenches 104, which all form in a silicon (Si) substrate/epitaxial layer 105. Each gate trench 104 may include a first conductive material 106 (e.g., poly 1) acting as a source/shield electrode at the bottom of a gate trench 104 and a second conductive material 108 (e.g., poly 2) providing a gate electrode at the top of the gate trench 104. The first and second conductive materials are electrically insulated from each other by insulating material including, e.g., an inter-poly-oxide (IPO) layer 110. The gate electrodes 108 are also electrically insulated from the Schottky diode 302 and contact metal 312 by insulating material 115. As shown in FIG. 3, the Schottky diode 302 includes a multi-layer barrier metal 301 located at the sidewall and the bottom of the trench 102 and a tungsten plug 310 deposited into the remaining of the trench 102. In this example, the multi-layer barrier metal 301 is a triple layer barrier that includes a middle metal layer 306 sandwiched between a first Ti/TiN layer 304 and second Ti/TiN layer 308. In some versions of this embodiment Titanium and Titanium Nitride (TiN) may be replaced with Tantalum and Tantalum Nitride (TaN), respectively in the first and/or second layers 304, 308. The middle metal layer 306 includes at least one metal that is different from the metals of the first and second layers. The contact trench 102 also makes contact to the source 103 and body 107 regions.

The addition of the middle layer 306 improves coverage of the sidewalls of the trench and blocks the diffusion of Tungsten from the plug 310 into the silicon of the substrate. It also raises the tungsten plug 310 up away from the Schottky region, so any contamination through the sidewall would be further away from the vulnerable Schottky diode 302 region below. By way of example, and not by way of limitation, the middle metal layer may include Aluminum-silicon-copper (AlSiCu). In alternative versions of this embodiment, the middle layer 306 may include only Cu, or just AlSi, AlCu or an Aluminum alloy. In the case of middle layer 306 of AlSiCu, the Aluminum component in the AlSiCu tends to bring Tungsten 310 further away froth the bottom of the trench than at the sidewall of the trench. The Silicon component in the AlSiCu prevents Aluminum from reacting with the Silicon substrate. The second Ti/TiN layer 308, which may be optional, may be used to prevent a reaction between the tungsten of the plug 310 and aluminum during high temperature deposition of tungsten.

By way of example, and not by way of limitation, the barrier layer 301 may be formed by first depositing a Ti layer about 500 Angstrom thick on the sidewall of the trench 102 followed by depositing a TiN layer about 500 Angstrom thick to form the first Ti/TiN layer 304. The middle layer 306 may be formed to a thickness of about 1000 Angstrom on the first Ti/TiN layer 304. By way of example, and not by way of limitation, the middle layer 306 may includes mostly Aluminum, about 1%±0.1% of Si and about 0.5%±0.1% Copper. This layer may be formed by sputter deposition using a commercially available sputter target that is 98.5% of Al, 1% Si and 0.5% Cu. Such sputter targets may be obtained from TOSOH and Sumitomo. After forming the middle layer 306, the second Ti/TiN layer 308 may then be deposited on top of the middle layer 306. The second Ti/TiN layer 308 may be formed similarly to the first Ti/TiN layer 304. For example, a Ti layer about 350 Angstrom thick may be deposited on the middle layer 306 followed by depositing a 400 Angstrom thick TiN layer on the Ti layer. The whole barrier metal 301 may be treated with rapid thermal processing (RTP), e.g., by heating at 750° C. Tungsten (W) may then be deposited onto the substrate and into remaining of the trench to form a W plug 310 followed by the etching back excess tungsten. An AlCu metal about 3 micron thick may be deposited on top of the W plug 310 to form a metal contact 312.

Figure 4A:
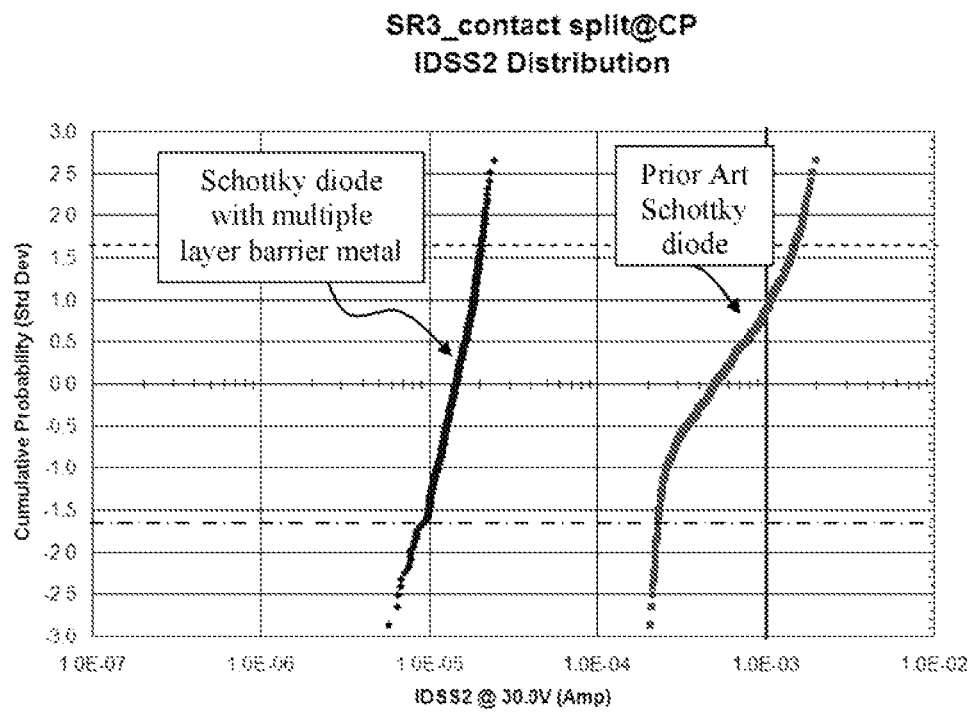
FIG. 4A is a graph illustrating the leakage current $I_{dss}$ distributions at a forward voltage $V_f$ of 30V of integrated Schottky diodes of the prior art and an embodiment of the present invention.
Figure 4B:
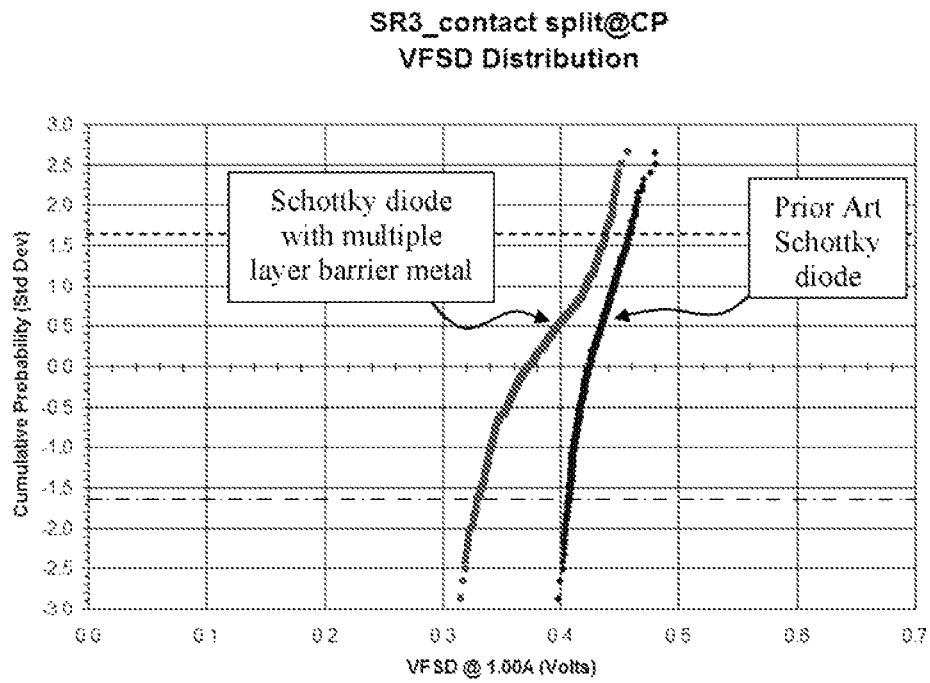
FIG. 4B is a graph illustrating the forward voltage distributions at a leakage current Idss of 1.00 A of the integrated Schottky diodes of the prior art and the present invention

The advantages of the multi-layer barrier metal of the type described herein may be understood by reference to FIGS. 4A-4B. FIG. 4A is a graph illustrating the leakage current $I_{dss}$ distributions at a forward voltage $V_f$ of 30V of a MOSFET with Schottky diode of the prior art (indicated by grey squares) and a MOSFET with Schottky diode with a multiple layer barrier metal according to an embodiment of the present invention (indicated by black diamonds) of the type shown in FIG. 3. Note that for a Schottky diode of the type shown in FIG. 3, the leakage current is consistently well below the device specification of $1 \times 10^{-3}$ amps, and with smoother deviation change than the prior art. FIG. 4B is a graph illustrating the forward voltage distributions at a forward current of 1.00 A for a Schottky diode of the prior art (grey squares) and a Schottky diode with a multiple layer barrier metal of the type shown in FIG. 3 (black diamonds). As shown in FIG. 4B, a Schottky diode of the type shown in FIG. 3 has a narrower range of forward voltage than the prior art Schottky diode under for a similar forward current, and a comparable (albeit slightly higher) forward voltage drop $V_f$.

Applications of the multiple layer barrier metal 301 described in FIG. 3 art is not limited to applications involving Schottky diodes in SGT MOSFET devices. This type of barrier metal structure can apply to all devices with (Schottky) contact trenches, including but not limited to all trench gate MOSFETs, planar gate MOSFETs, field effect transistors (FETs) and insulated gate bipolar transistors IGBTs.

Although the present invention has been described in considerable detail with reference to certain preferred versions thereof, other versions are possible. For example, although a three layer barrier metal is shown in FIG. 3, embodiments of the invention include two layer barrier metals and barrier metals made of more than three layers. Therefore, the spirit and scope of the appended claims should not be limited to the description of the preferred versions contained herein. Instead, the scope of the invention should be determined with reference to the appended claims, along with their full scope of equivalents. All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features. Any feature, whether preferred or not, may be combined with any other feature, whether preferred or not. In the claims that follow, the indefinite article "A", or "An" refers to a quantity of one or more of the item following the article, except where expressly stated otherwise. Any element in a claim that does not explicitly state "means for" performing a specified function, is not to be interpreted as a "means" or "step" clause as specified in 35 USC§112, ¶6. In particular, the use of "step of" in the claims herein is not intended to invoke the provisions of 35 USC§112, ¶6.

The reader's attention is directed to all papers and documents which are filed concurrently with this specification and which are open to public inspection with this specification, and the contents of all such papers and documents incorporated herein by reference.

What is claimed is:

1. A method for fabricating a semiconductor device formed on a semiconductor substrate including a low-doped region proximate a contact trench, the method comprising:
   a) forming the contact trench proximate the low-doped region;
   b) depositing a first metal layer on a bottom and sidewalls of the contact trench, wherein the first metal layer includes a nitride;
   c) depositing a second layer on top of the first layer and onto portions of the sidewalls not covered by the first metal layer, wherein the second metal layer blocks diffusion between tungsten and the semiconductor of the substrate;
   d) depositing a third metal layer on the second metal layer; and
   e) depositing tungsten in a remaining portion of the contact trench after d) to form a tungsten plug.

2. The method of claim 1 wherein the first metal layer further comprises Titanium nitride, the second metal layer comprises an Aluminum alloy, and the third metal layer comprises Titanium.

3. The method of claim 1 wherein the first metal layer further comprises Titanium and/or Titanium nitride, the second metal layer comprises Aluminum-Silicon-Copper, and the third metal layer comprises Titanium and/or Titanium nitride.

4. The method of claim 1, wherein the first metal layer further includes Titanium.

5. The method of claim 4 wherein the first metal layer includes approximately 500 Angstroms of Titanium and approximately 500 Angstroms of Titanium nitride.

6. The method of claim 1, wherein the third metal layer includes approximately 350 Angstroms of Titanium and approximately 400 Angstroms of titanium nitride.

7. The method of claim 1 wherein the first and third metal layers include titanium and/or titanium nitride.

8. The method of claim 1 wherein the second metal layer includes aluminum-silicon, aluminum-copper, an aluminum alloy, or aluminum-silicon-copper.

9. The method of claim 1, wherein the second metal layer includes aluminum-silicon-copper.

10. The method of claim 1 wherein the first metal layer further includes Titanium.

11. The method of claim 1 wherein the second metal layer includes aluminum alloy.

12. The method of claim 1 wherein the contact trench has a width less than about 0.35 microns.

13. The method of claim 1 wherein the contact trench is characterized by an aspect ratio of about 2.5:1 or greater.

14. The method of claim 1 wherein steps b) and c) further comprise raising the tungsten higher than it would be if there was only a single barrier metal layer.

15. The method of claim 1 wherein the low-doped region in conjunction with the metal layers in the contact trench comprise a Schottky diode.

16. A method for fabricating a semiconductor device formed on a semiconductor substrate including a low-doped region proximate a contact trench, the method comprising:
   a) forming the contact trench proximate the low-doped region;
   b) depositing a first metal layer on a bottom and sidewalls of the contact trench, wherein the first metal layer includes a nitride;
   c) depositing a second layer on top of the first layer and onto portions of the sidewalls not covered by the first metal layer, wherein the second metal layer blocks diffusion between tungsten and the semiconductor of the substrate; and d) depositing tungsten in a remaining portion of the contact trench to form a tungsten plug, wherein the second metal layer includes Aluminum-copper.

17. A method for fabricating a semiconductor device formed on a semiconductor substrate including a low-doped region proximate a contact trench, the method comprising:

a) forming the contact trench proximate the low-doped region;

b) depositing a first metal layer on a bottom and sidewalls of the contact trench wherein the first metal layer includes a nitride;

c) depositing a second layer on top of the first layer and onto portions of the sidewalls not covered by the first metal layer, wherein the second metal layer blocks diffusion between tungsten and the semiconductor of the substrate; and d) depositing tungsten in a remaining portion of the contact trench to form a tungsten plug, wherein the second metal layer includes an aluminum alloy.

* * * * *